US008772696B2

(12) United States Patent
Sato

(10) Patent No.: US 8,772,696 B2
(45) Date of Patent: Jul. 8, 2014

(54) SOLID-STATE IMAGING DEVICE HAVING AN AMPLIFICATION TRANSISTOR SHARED BY PIXELS OF A CELL AND A PLURALITY OF RESET TRANSISTORS FOR RESETTING READ OUT SIGNALS FROM THE PIXELS

(75) Inventor: Maki Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 13/402,269

(22) Filed: Feb. 22, 2012

(65) Prior Publication Data

US 2012/0228474 A1    Sep. 13, 2012

(30) Foreign Application Priority Data

Mar. 8, 2011  (JP) .................................. 2011-049857

(51) Int. Cl.
  *H01L 27/00*    (2006.01)
(52) U.S. Cl.
  USPC .................................... 250/208.1; 250/214 R
(58) Field of Classification Search
  USPC ................ 250/208.1, 214 R, 214 LA, 214 A; 257/291, 292, 215, 221–230; 348/294–311
  See application file for complete search history.

(56) References Cited

U.S. PATENT DOCUMENTS 8,547,458 B2 * 10/2013 Iwasawa ........................ 348/272

FOREIGN PATENT DOCUMENTS

| JP | 2006-49611 A | 2/2006 |
|---|---|---|
| JP | 2006-73732 A | 3/2006 |
| JP | 2006-179848 | 7/2006 |
| JP | 2007-180336 A | 7/2007 |
| JP | 2008-124237 | 5/2008 |
| JP | 2009-26984 A | 2/2009 |
| JP | 2009-117878 A | 5/2009 |
| JP | 2010-103667 | 5/2010 |

OTHER PUBLICATIONS

Japanese Office Action issued Jun. 18, 2013 in Patent Application No. 2011-049857 with English Translation.

* cited by examiner

*Primary Examiner* — Que T Le
(74) *Attorney, Agent, or Firm* — Oblon, Spivak, McClelland, Maier & Neustadt, L.L.P.

(57) ABSTRACT

While a drain power source of a reset transistor and a drain power source of an amplifying transistor are separated, the load of drain power source can be reduced by sharing a drain diffusion layer of the reset transistor and a drain diffusion layer of the amplifying transistor and a pixel amp transistor by adjacent cells in sharing pixel units. Further, it is possible to perform layout setting for the floating diffusions such that parasitic capacitances between the floating diffusions are equal to each other. It is possible to prevent step-like noise from occurring among the pixels while improving sensitivity.

20 Claims, 9 Drawing Sheets

SOLID-STATE IMAGING DEVICE HAVING AN AMPLIFICATION TRANSISTOR SHARED BY PIXELS OF A CELL AND A PLURALITY OF RESET TRANSISTORS FOR RESETTING READ OUT SIGNALS FROM THE PIXELS

CROSS-REFERENCE TO RELATED APPLICATIONS

This application is based upon and claims the benefit of priority from Japanese Patent Application No. 2011-49857, filed on Mar. 8, 2011; the entire contents of which are incorporated herein by reference.

FIELD

Embodiments described herein relate generally to a solid-state imaging device.

BACKGROUND

In a CMOS image sensor that adopts a structure for sharing a plurality of pixels to realize microminiaturization of the pixels, there is a method of providing drain power supplies for a reset transistor and an amplification transistor of the CMOS image sensor as separate power supplies to reduce the driving load of the pixels.

In this method, the capacitive load of a vertical data line is small compared with capacitive load applied when the drain power supply for the reset transistor and the drain power supply for the amplification transistor are the same power supply. Therefore, high-speed operation can be performed.

On the other hand, in the structure for sharing a plurality of pixels in the past, a floating diffusion is divided and one reset transistor and one amplification transistor are shared for a plurality of pixels. When the drain power supply for the reset transistor and the drain power supply for the amplification transistor are separately power supplies, drain diffusion layers of reset transistors and drain diffusion layers of amplification transistors of cells have to be separately arranged to be laid out.

Therefore, it is difficult to symmetrically arrange a plurality of divided floating diffusions with respect to the reset transistor and the amplification transistor. Parasitic capacitances are different among the floating diffusions. As a result, step-like noise could occur among the pixels.

DETAILED DESCRIPTION

In general, according to one embodiment, a solid-state imaging device includes a cell, an amplification transistor, and a plurality of reset transistors. The cell includes K (K is an integer equal to or larger than 2) pixels. The amplification transistor is shared by the K pixels and amplifies signals read out from the pixels. The reset transistors reset the signals read out from the K pixels.

Exemplary embodiments are explained below with reference to the accompanying drawings. The present invention is not limited by the embodiments.

First Embodiment

Figure 1:
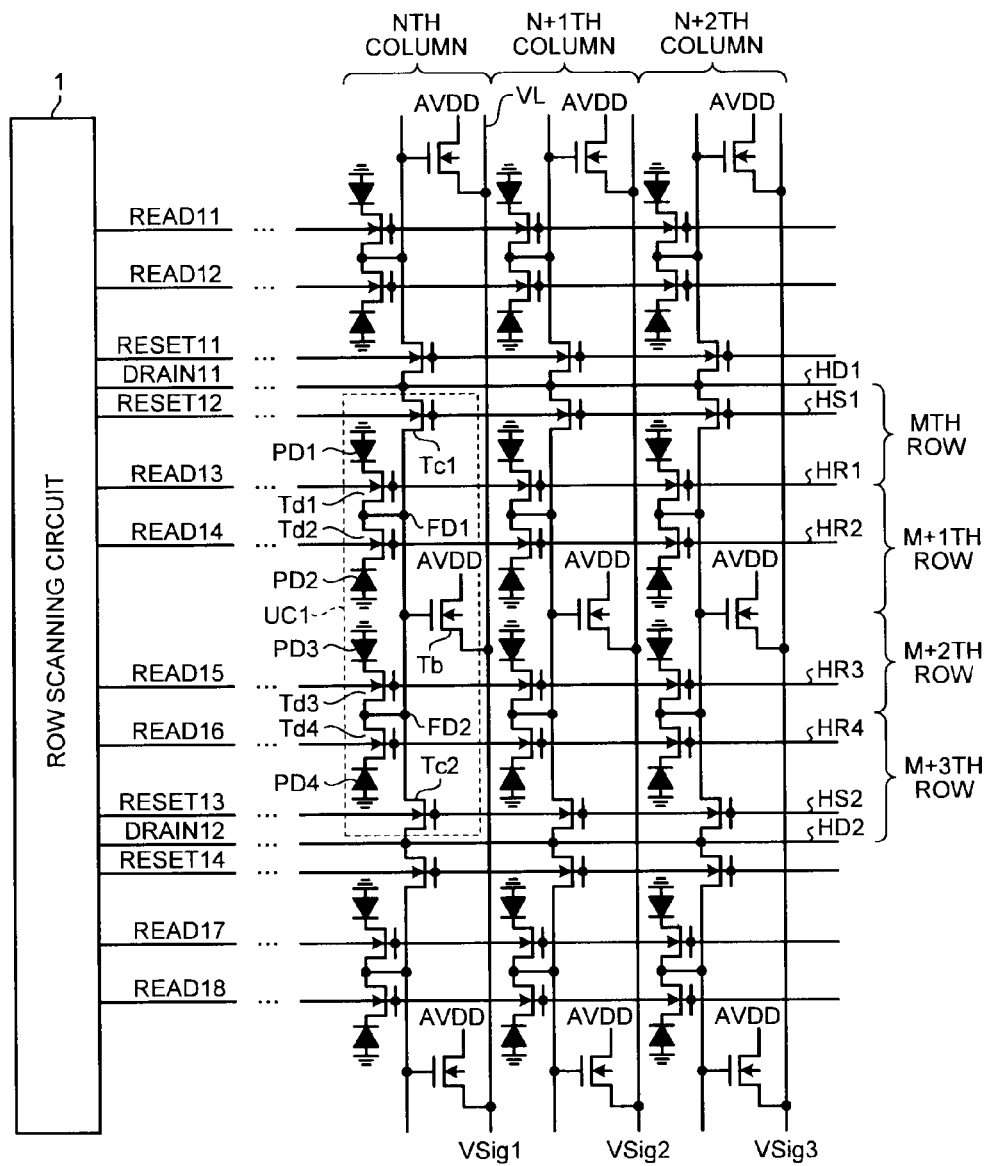
FIG. 1 is a block diagram of a schematic configuration of a solid-state imaging device according to a first embodiment.

FIG. 1 is a block diagram of a schematic configuration of a solid-state imaging device according to a first embodiment.

In FIG. 1, in the solid-state imaging device, cells UC1 are arranged in a matrix shape in a row direction and a column direction. Each of the cells UC1 includes four photodiodes PD1 to PD4, four readout transistors Td1 to Td4, two reset transistors Tc1 and Tc2, two floating diffusions FD1 and FD2, and one amplification transistor Tb.

The photodiodes PD1 to PD4 can convert light from an imaging target into electric signals in a pixel unit. The readout transistors Td1 to Td4 can respectively read out the signals photoelectrically converted by the photodiodes PD1 to PD4. The reset transistors Tc1 and Tc2 can simultaneously reset the signals read out from the photodiodes PD1 to PD4. The floating diffusions FD1 and FD2 are electrically connected to each other and can detect the signals read out from the photodiodes PD1 to PD4. The amplification transistor Tb is shared by the photodiodes PD1 to PD4 and can amplify the signals read out from the photodiodes PD1 to PD4.

The photodiodes PD1 to PD4 are arranged side by side in the longitudinal direction. The photodiode PD1 can be arranged in an Mth (M is a positive integer) row, the photodiode PD2 can be arranged in an M+1th row, the photodiode PD3 can be arranged in an M+2th row, and the photodiode PD4 can be arranged in an M+3th row. The floating diffusion FD1 is used in common as drains of the readout transistors Td1 and Td2. The floating diffusion FD2 is used in common as drains of the readout transistors Td3 and Td4. Sources of the readout transistors Td1 to Td4 are respectively connected to the photodiodes PD1 to PD4.

The floating diffusions FD1 and FD2 are arranged to be symmetrical to each other with respect to the amplification transistor Tb. The reset transistors Tc1 and Tc2 are arranged to be symmetrical to each other with respect to the amplification transistor Tb.

The reset transistor Tc1 is arranged at the upper end of the cell UC1. The reset transistor Tc2 is arranged at the lower end of the cell UC1. A drain of the reset transistor Tc1 is used in common as a drain of the reset transistor Tc2 of a cell adjacent on the upper side of the cell UC1 to which the reset transistor Tc1 belongs. A drain of the reset transistor Tc2 is used in common as a drain of the reset transistor Tc1 of a cell adjacent on the lower side of the cell UC1 to which the reset transistor Tc2 belongs. A source of the reset transistor Tc1 is connected to the floating diffusion FD1. A source of the reset transistor Tc2 is connected to the floating diffusion FD2.

Further, the solid-state imaging device includes a row scanning circuit 1 that scans the pixels row by row and a vertical data line VL that transmits, column by column, signals read out from the pixels. Drain power supply lines HD1 and HD2, reset control lines HS1 and HS2, and readout control lines HR1 to HR4 are connected to the row scanning circuit 1. When signals are read out from the pixels of the cell UC1, the row scanning circuit 1 can drive the reset control lines HS1 and HS2 as a set. The readout control lines HR1 to HR4 are provided row by row and are respectively connected to gates of the readout transistors Td1 to Td4. The reset control lines HS1 and HS2 are provided in the Mth row and the M+3th row and respectively connected to gates of the reset transistors Tc1 and Tc2. The drain power supply line HD1 is arranged in a boundary with the cell UC1 adjacent on the upper side and connected to the drain of the reset transistor Tc1. The drain power supply line HD2 is arranged in a boundary with the cell UC1 adjacent on the lower side and connected to the drain of the reset transistor Tc2.

This row scan line is connected to the row scanning circuit 1 in a repeating unit.

A gate of the amplification transistor Tb is connected to the floating diffusions FD1 and FD2. A source of the amplification transistor Tb is connected to the vertical data line VL. A drain of the amplification transistor Tb is connected to a drain power supply AVDD.

The drain power supply AVDD can be connected in common to drains of the amplification transistors Tb of all the cells UC1 of the solid-state imaging device. The voltage of the drain power supply AVDD can be set to a fixed value.

Figure 2:
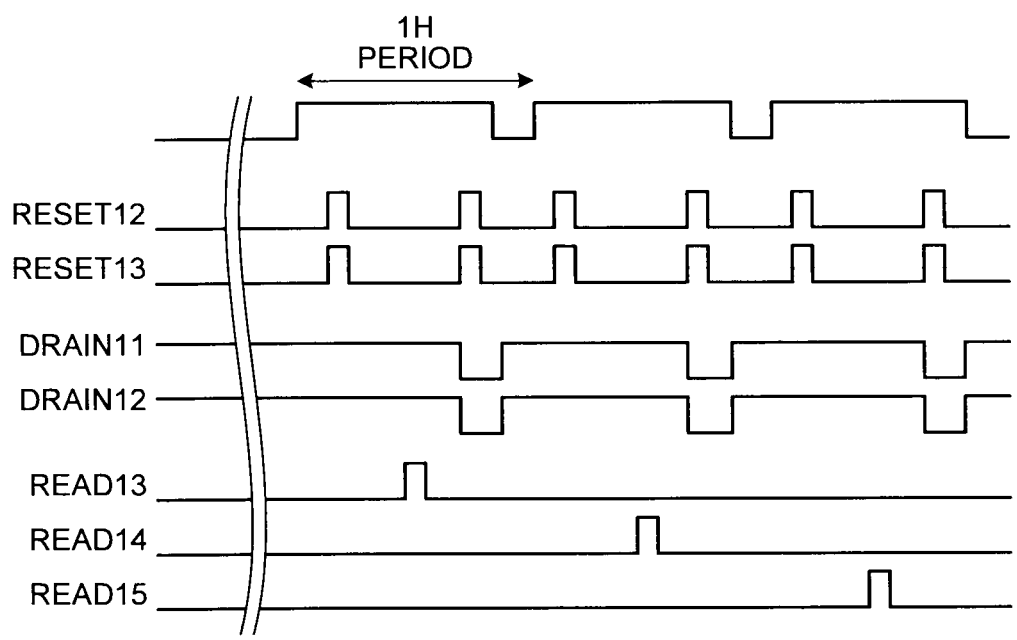
FIG. 2 is a timing chart of readout operation of the solid-state imaging device shown in FIG. 1.

FIG. 2 is a timing chart of readout operation of the solid-state imaging device shown in FIG. 1.

In FIG. 2, for example, signals are read out from the pixels in the Mth row. Reset signals RESET12 and RESET13 are respectively given to the reset control lines HS1 and HS2, whereby the reset transistors Tc1 and Tc2 are turned on and the charges of the floating diffusions FD1 and FD2 are reset. A voltage corresponding to a reset level of the floating diffusions FD1 and FD2 is applied to the gate of the amplification transistor Tb. The voltage of the vertical data line VL in an Nth (N is a positive integer) column follows the voltage applied to the gate of the amplification transistor Tb, whereby a pixel signal VSig1 at the reset level is output to the vertical data line VL in the Nth column. The amplification transistor Tb can configure a load transistor and a source follower connected to the vertical data line VL.

Subsequently, a read signal READ13 is given to the readout control line HR1, whereby the readout transistor Td1 is turned on and charges detected by the photodiode PD1 are transferred to the floating diffusions FD1 and FD2. A voltage corresponding to a signal level of the floating diffusions FD1 and FD2 is applied to the gate of the amplification transistor Tb. The voltage of the vertical data line VL in the Nth column follows the voltage applied to the gate of the amplification transistor Tb, whereby the pixel signal VSig1 at the signal level is output to the vertical data line VL in the Nth column.

The reset signals RESET12 and RESET13 are respectively given to the reset control lines HS1 and HS2, whereby the reset transistors Tc1 and Tc2 are turned on. At this point, drain pulses DRAIN11 and DRAIN12 are respectively given to the drain power supply lines HD1 and HD2, whereby the potential of the floating diffusions FD1 and FD2 is set to power supply potential. The drain pulses DRAIN11 and DRAIN12 are collectively given to the drains of the reset transistors Tc1 and Tc2 of all the cells UC1 of the solid-state imaging device.

When the potential of the floating diffusions FD1 and FD2 is set to the power supply potential, the amplification transistor Tb is turned off and the pixels are separated from the vertical data line VL. Therefore, after reading out signals from the pixels, by setting the potential of the floating diffusions FD1 and FD2 of all the cells UC1 to the power supply potential, it is possible to prevent the vertical data line VL from being driven based on signals from pixels other than readout target pixels.

Subsequently, signals are read out from the pixels in the M+1th row. The reset signals RESET12 and RESET13 are respectively given to the reset control lines HS1 and HS2, whereby the reset transistors Tc1 and Tc2 are turned on and the charges of the floating diffusions FD1 and FD2 are reset. A voltage corresponding to the reset level of the floating diffusions FD1 and FD2 is applied to the gate of the amplification transistor Tb. The voltage of the vertical data line VL in the Nth column follows the voltage applied to the gate of the amplification transistor Tb, whereby the pixel signal VSig1 at the reset level is output to the vertical data line VL in the Nth column.

A read signal READ14 is given to the readout control line HR2, whereby the readout transistor Td2 is turned on and charges detected by the photodiode PD2 are transferred to the floating diffusions FD1 and FD2. A voltage corresponding to a signal level of the floating diffusions FD1 and FD2 is applied to the gate of the amplification transistor Tb. The voltage of the vertical data line VL in the Nth column follows the voltage applied to the gate of the amplification transistor Tb, whereby the pixel signal VSig1 at the signal level is output to the vertical data line VL in the Nth column.

The reset signals RESET12 and RESET13 are respectively given to the reset control lines HS1 and HS2, whereby the reset transistors Tc1 and Tc2 are turned on. At this point, the drain pulses DRAIN11 and DRAIN12 are respectively given to the drain power supply lines HD1 and HD2, whereby the potential of the floating diffusions FD1 and FD2 is set to the power supply potential.

Subsequently, signals are read out from the pixels in the M+2th row. The reset signals RESET12 and RESET13 are respectively given to the reset control lines HS1 and HS2, whereby the reset transistors Tc1 and Tc2 are turned on and the charges of the floating diffusions FD1 and FD2 are reset. A voltage corresponding to a reset level of the floating diffusions FD1 and FD2 is applied to the gate of the amplification transistor Tb. The voltage of the vertical data line VL in the Nth column follows the voltage applied to the gate of the amplification transistor Tb, whereby the pixel signal VSig1 at the reset level is output to the vertical data line VL in the Nth column.

A read signal READ15 is given to the readout control line HR3, whereby the readout transistor Td3 is turned on and charges detected by the photodiode PD3 are transferred to the floating diffusions FD1 and FD2. A voltage corresponding to a signal level of the floating diffusions FD1 and FD2 is applied to the gate of the amplification transistor Tb. The voltage of the vertical data line VL in the Nth column follows the voltage applied to the gate of the amplification transistor Tb, whereby the pixel signal VSig1 at the signal level is output to the vertical data line VL in the Nth column.

The reset signals RESET12 and RESET13 are respectively given to the reset control lines HS1 and HS2, whereby the reset transistors Tc1 and Tc2 are turned on. At this point, the drain pulses DRAIN11 and DRAIN12 are respectively given to the drain power supply lines HD1 and HD2, whereby the potential of the floating diffusions FD1 and FD2 is set to the power supply potential.

By providing the two reset transistors Tc1 and Tc2 in the cell UC1 in which four pixels are shared by the one amplification transistor Tb, it is possible to arrange the reset transistors Tc1 and Tc2 to be symmetrical to each other with respect to the amplification transistor Tb. Therefore, it is possible to perform layout setting for the floating diffusions FD1 and FD2 such that parasitic capacitances between the floating diffusions FD1 and FD2 are equal to each other. It is possible to prevent step-like noise from occurring among the pixels.

By separating the drain power supply lines HD1 and HD2 from the drain power supply AVDD, it is possible to reduce the capacitive load of the vertical data line VL. Therefore, it is possible to realize high-speed operation, fix the drain potential of the amplification transistor Tb, and reduce a swing of the potential of the vertical data line VL to reduce noise.

By driving, as a set, the reset control lines HS1 and HS2 of the reset transistors Tc1 and Tc2 shared by the same amplification transistor Tb, even when the two reset transistors Tc1 and Tc2 are provided in the one cell UC1, it is possible to prevent signals of the floating diffusions FD1 and FD2 from interfering with each other and accurately set a reset level.

Figure 3:
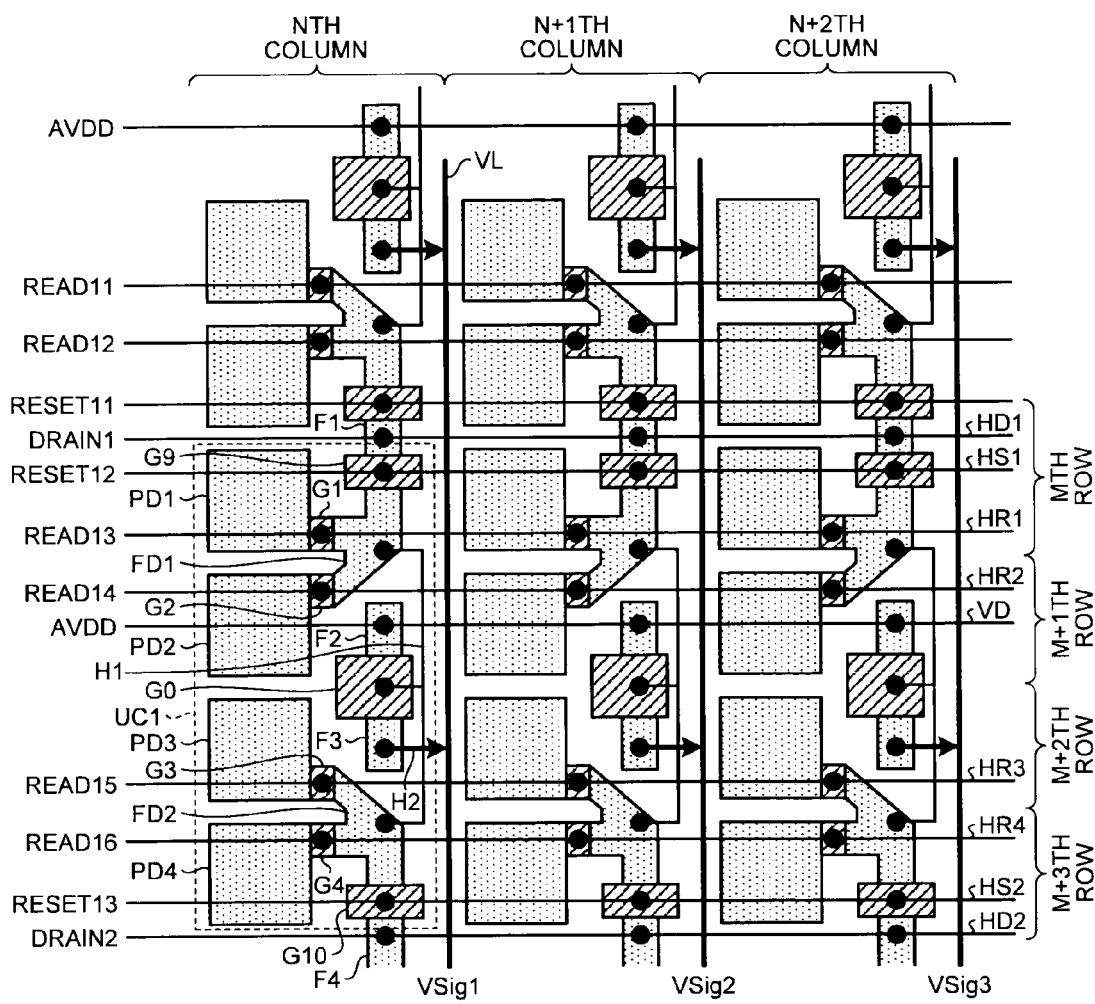
FIG. 3 is a plan view of a layout configuration of a pixel array section of the solid-state imaging device shown in FIG. 1.

FIG. 3 is a plan view of a layout configuration of a pixel array section of the solid-state imaging device shown in FIG. 1.

In FIG. 3, on a semiconductor substrate, the four photodiodes PD1 to PD4 are arranged side by side in the longitudinal direction in a unit of the cell UC1. The floating diffusion FD1 is arranged to be adjacent to the photodiodes PD1 and PD2. The floating diffusion FD2 is arranged to be adjacent to the photodiodes PD3 and PD4.

A gate electrode G1 is arranged between the photodiode PD1 and the floating diffusion FD1. A gate electrode G2 is arranged between the photodiode PD2 and the floating diffusion FD1. A gate electrode G3 is arranged between the photodiode PD3 and the floating diffusion FD2. A gate electrode G4 is arranged between the photodiode PD4 and the floating diffusion FD2. The gate electrodes G1 to G4 can respectively configure the readout transistors Td1 to Td4.

An impurity diffusion layer F1 is arranged in a boundary with a cell adjacent on the upper side. A gate electrode G9 is arranged between the floating diffusion FD1 and the impurity diffusion layer F1. An impurity diffusion layer F4 is arranged in a boundary with a cell adjacent on the lower side. A gate electrode G10 is arranged between the floating diffusion FD2 and the impurity diffusion layer F4. The gate electrodes G9 and G10 can respectively configure the reset transistors Tc1 and Tc2.

Impurity diffusion layers F2 and F3 are arranged between the floating diffusions FD1 and FD2. A gate electrode G0 is arranged between the impurity diffusion layers F2 and F3. The gate electrode G0 can configure the amplification transistor Tb. The floating diffusions FD1 and FD2 are arranged to be symmetrical to each other with respect to the gate electrode G0. The upper side and the lower side of the cell UC1 are arranged in a mirror image relation with respect to the gate electrode G0.

The reset transistors Tc1 and Tc2 and the amplification transistor Tb of the cell UC1 are arranged between the photodiodes PD1 to PD4 in the Nth column and the photodiodes PD1 to PD4 in the N+1th column.

The floating diffusions FD1 and FD2 are connected to the gate electrode G0 via a wire H1. The impurity diffusion layer F3 is connected to the vertical data line VL via a wire H2. The drain power supply line HD1 is connected to the impurity diffusion layer F1. The drain power supply line HD2 is connected to the impurity diffusion layer F4.

The reset control line HS1 is connected to the gate electrode G9. The reset control line HS2 is connected to the gate electrode G10. The readout control lines HR1 to HR4 are respectively connected to the gate electrodes G1 to G4. A power supply line VD is connected to the impurity diffusion layer F2. The power supply line VD can supply the drain power supply AVDD.

The readout transistors Td1 to Td4, the reset transistors Tc1 and Tc2, the floating diffusions FD1 and FD2, and the amplification transistor Tb can be arranged on the front surface side of the semiconductor substrate. The photodiodes PD1 to PD4 can be arranged on the rear surface side of the semiconductor substrate. In this case, wires such as the reset control lines HS1 and HS2, the readout control lines HR1 to HR4, and the power supply line VD can be arrange to overlap the photodiodes PD1 to PD4. Therefore, it is possible to improve a degree of freedom of the layout of the wires.

The floating diffusions FD1 and FD2 are arranged to be symmetrical to each other with respect to the gate electrode G0. Therefore, it is possible to perform layout setting for the floating diffusions FD1 and FD2 such that parasitic capacitances between the floating diffusions FD1 and FD2 are equal to each other. It is possible to prevent step-like noise from occurring among the pixels.

In the example shown in FIG. 3, the method of wiring the drain power supply lines HD1 and HD2 and the power supply line VD in the lateral direction is explained. However, the drain power supply lines HD1 and HD2 and the power supply line VD can be wired in the longitudinal direction.

Second Embodiment

Figure 4:
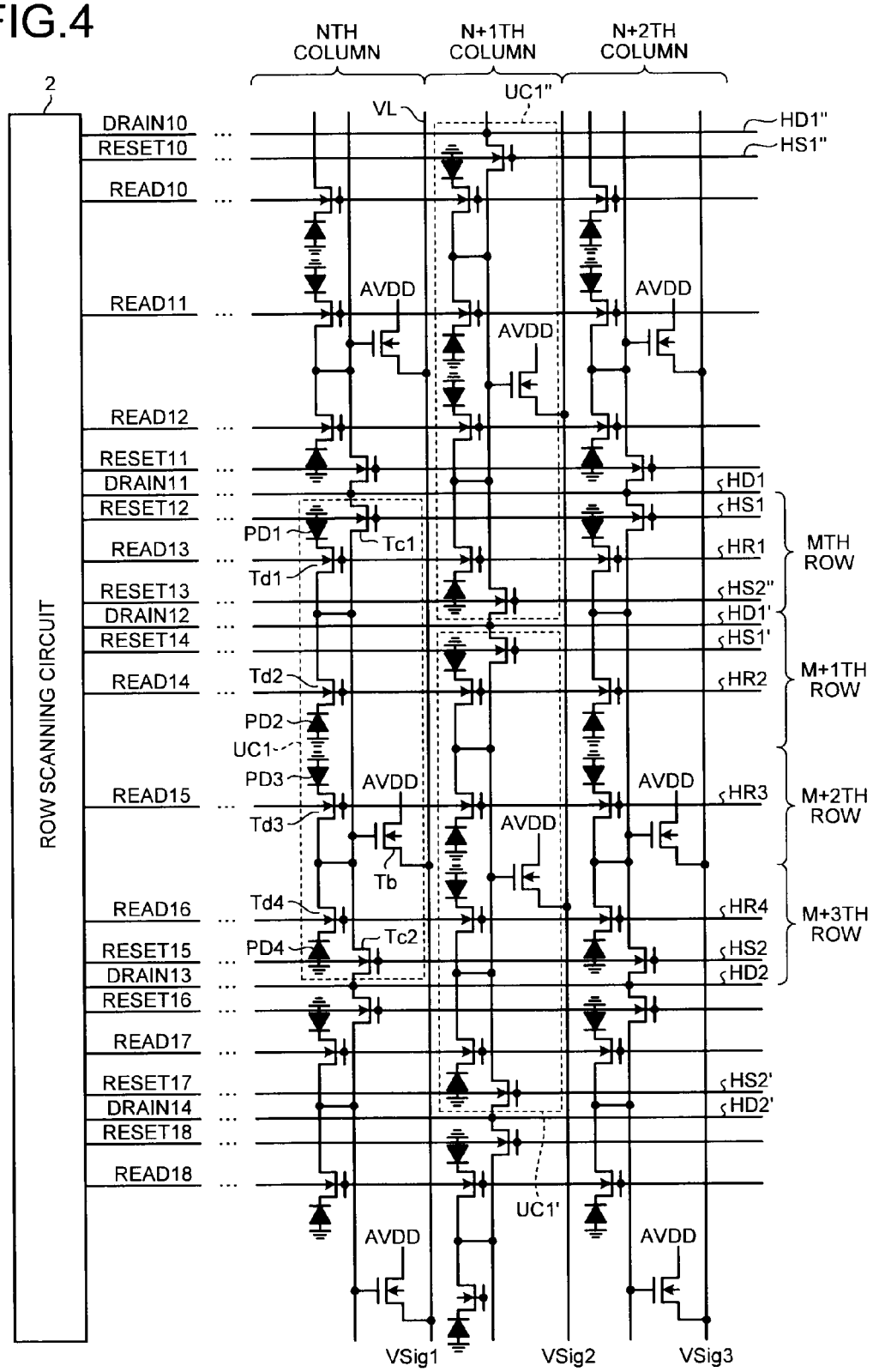
FIG. 4 is a block diagram of a schematic configuration of a solid-state imaging device according to a second embodiment.

FIG. 4 is a block diagram of a schematic configuration of a solid-state imaging device according to a second embodiment.

In FIG. 4, in the solid-state imaging device, the cells UC1 are arranged in a matrix shape in a row direction and a column direction. The configuration of the cell UC1 shown in FIG. 4 is the same as the configuration of the cell UC1 shown in FIG. 1. However, cells UC1' and UC1" in the N+1th column shown in FIG. 4 are arranged to be shifted in the longitudinal direction by two pixels with respect to the cell UC1 in the Nth column.

In the cell UC1' in the N+1th column, drain power supply lines HD1' and HD2' and reset control lines HS1' and HS2' are provided separately from the drain power supply lines HD1 and HD2 and the reset control lines HS1 and HS2 of the cell UC1 in the Nth column.

The reset control lines HS1' and HS2' are respectively connected to the gates of the reset transistors Tc1 and Tc2 of the cell UC1' in the N+1th column. The drain power supply line HD1' is arranged in a boundary with the cell UC1' adjacent on the upper side in the N+1th column and connected to the drain of the reset transistor Tc1 of the cell UC1' in the N+1th column. The drain power supply line HD2' is arranged in a boundary with the cell UC1' adjacent on the lower side in the N+1th column and connected to the drain of the reset transistor Tc2 of the cell UC1' in the N+1th column.

In the cell UC1' in the N+1th column, the readout control line HR1 is connected to a gate of the readout transistor Td4. The readout control line HR2 is connected to a gate of the transistor Td1. The readout control line HR3 is connected to a gate of the readout transistor Td2. The readout control line HR4 is connected to a gate of the readout transistor Td3.

In the solid-state imaging device, a row scanning circuit 2 is provided instead of the row scanning circuit 1 shown in FIG. 1. Drain power supply lines HD1, HD2, HD1', HD2', HD1", and HD2", reset control lines HS1, HS2, HS1', HS2', HS1", and HS2", and the readout control lines HR1 to HR4 are connected to the row scanning circuit 2. For example, when a signal is read out from a pixel in the Nth column and the Mth row, the row scanning circuit 2 drives the reset control lines HS1, HS2, HS1", and HS2" as a set. When a signal is read out from a pixel in the Nth column and the M+1th row, the row scanning circuit 2 drives the reset control lines HS1, HS2, HS1', and HS2' as a set.

This row scan line is connected to the row scanning circuit 2 in a repeating unit.

Figure 5:
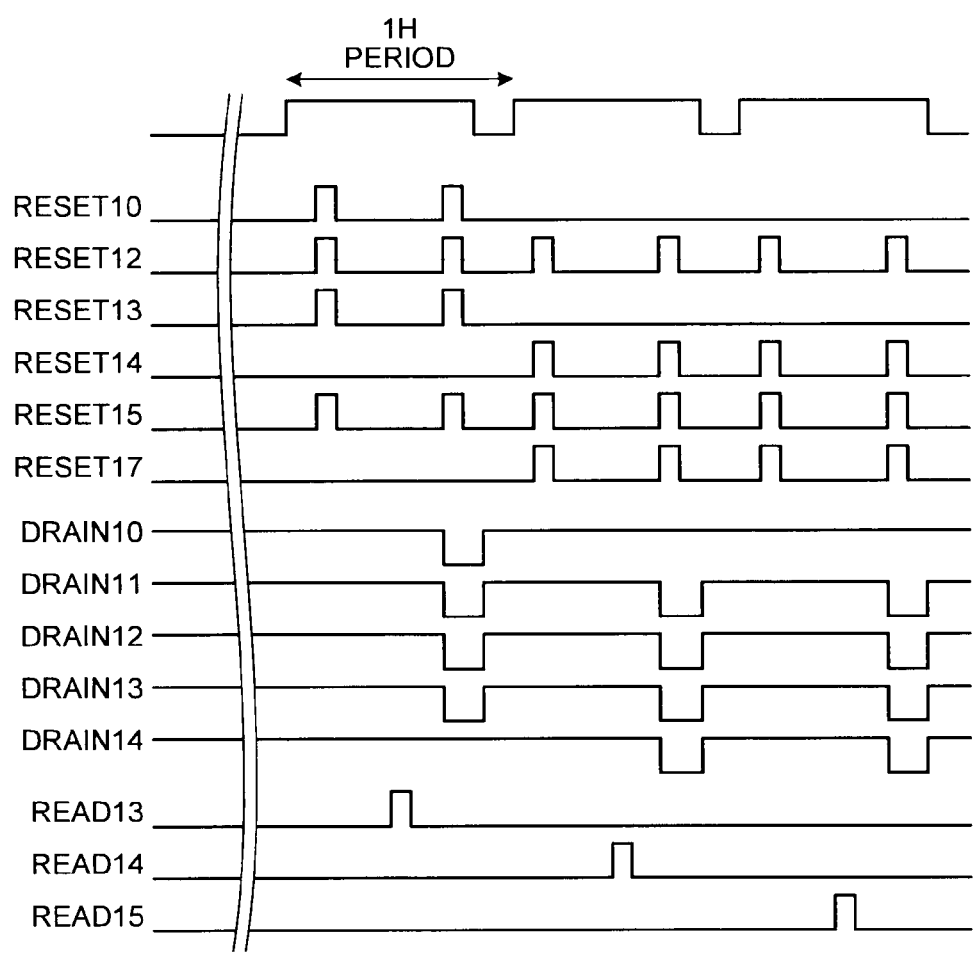
FIG. 5 is a timing chart of readout operation of the solid-state imaging device shown in FIG. 4.

FIG. 5 is a timing chart of readout operation of the solid-state imaging device shown in FIG. 4.

In FIG. 5, for example, a signal is read out from the pixel in the Nth column and the Mth row. Reset signals RESET12 and RESET15 are respectively given to the reset control lines HS1 and HS2, whereby the reset transistors Tc1 and Tc2 of the cell UC1 are turned on and the charges of the floating diffusions FD1 and FD2 of the cell UC1 are reset. A voltage corresponding to a reset level of the floating diffusions FD1 and FD2 of the cell UC1 is applied to the gate of the amplification transistor Tb of the cell UC1. The voltage of the vertical data line VL in the Nth column follows the voltage applied to the gate of the amplification transistor Tb of the cell UC1, whereby the pixel signal VSig1 at the reset level is output to the vertical data line VL in the Nth column.

At this point, reset signals RESET10 and RESET13 are respectively given to the reset control lines HS1" and HS2", whereby the reset transistors Tc1 and Tc2 of the cell UC1" are turned on and the charges of the floating diffusions FD1 and FD2 of the cell UC1" are reset. A voltage corresponding to a reset level of the floating diffusions FD1 and FD2 of the cell UC1" is applied to the gate of the amplification transistor Tb of the cell UC1". The voltage of the vertical data line VL in the N+1th column follows the voltage applied to the gate of the amplification transistor Tb of the cell UC1", whereby a pixel signal VSig2 at the reset level is output to the vertical data line VL in the N+1th column.

Subsequently, the read signal READ13 is given to the readout control line HR1, whereby the readout transistor Td1 of the cell UC1 is turned on and charges detected by the photodiode PD1 of the cell UC1 are transferred to the floating diffusion FD1 and FD2 of the cell UC1. A voltage corresponding to a signal level of the floating diffusions FD1 and FD2 of the cell UC1 is applied to the gate of the amplification transistor Tb of the cell UC1. The voltage of the vertical data line VL in the Nth column follows the voltage applied to the gate of the amplification transistor Tb of the cell UC1, whereby the pixel signal VSig1 at the signal level is output to the vertical data line VL in the Nth column.

When the read signal READ13 is given to the readout control line HR1, the readout transistor Td4 of the cell UC1" is turned on and charges detected by the photodiode PD4 of the cell UC1" are transferred to the floating diffusions FD1 and FD2 of the cell UC1". A voltage corresponding to a signal level of the floating diffusions FD1 and FD2 of the cell UC1" is applied to the gate of the amplification transistor Tb of the cell UC1". The voltage of the vertical data line VL in the N+1th column follows the voltage applied to the gate of the amplification transistor Tb of the cell UC1", whereby the pixel signal VSig2 at the signal level is output to the vertical data line VL in the N+1th column.

The reset signals RESET12 and RESET15 are respectively given to the reset control lines HS1 and HS2, whereby the reset transistors Tc1 and Tc2 of the cell UC1 are turned on. At this point, drain pulses DRAIN11 and DRAIN13 are respectively given to the drain power supply lines HD1 and HD2, whereby the potential of the floating diffusions FD1 and FD2 of the cell UC1 is set to the power supply potential.

The reset signals RESET10 and RESET13 are respectively given to the reset control lines HS1" and HS2", whereby the reset transistors Tc1 and Tc2 of the cell UC1" are turned on. At this point, drain pulses DRAIN10 and DRAIN12 are respectively given to the drain power supply lines HD1" and HD1', whereby the potential of the floating diffusions FD1 and FD2 of the cell UC1" is set to the power supply potential.

Subsequently, a signal is read out from a pixel in the Nth column and the M+1th row. The reset signals RESET12 and RESET15 are respectively given to the reset control lines HS1 and HS2, whereby the reset transistors Tc1 and Tc2 of the cell UC1 are turned on and the charges of the floating diffusions FD1 and FD2 of the cell UC1 are reset. A voltage corresponding to a reset level of the floating diffusions FD1 and FD2 of the cell UC1 is applied to the gate of the amplification transistor Tb of the cell UC1. The voltage of the vertical data line VL in the Nth column follows the voltage applied to the gate of the amplification transistor Tb of the cell UC1, whereby the pixel signal VSig1 at the reset level is output to the vertical data line VL in the Nth column.

At this point, reset signals RESET15 and RESET17 are respectively given to the reset control lines HS1' and HS2', whereby the reset transistors Tc1 and Tc2 of the cell UC1' are turned on and the charges of the floating diffusions FD1 and FD2 of the cell UC1' are reset. A voltage corresponding to a reset level of the floating diffusions FD1 and FD2 of the cell UC1' is applied to the gate of the amplification transistor Tb of the cell UC1'. The voltage of the vertical data line VL in the N+1th column follows the voltage applied to the gate of the amplification transistor Tb of the cell UC1', whereby the pixel signal VSig2 at the reset level is output to the vertical data line VL in the N+1th column.

The read signal READ14 is given to the readout control line HR2, whereby the readout transistor Td1 of the cell UC1 is turned on and charges detected by the photodiode PD1 of the cell UC1 are transferred to the floating diffusions FD1 and FD2 of the cell UC1. A voltage corresponding to a signal level of the floating diffusions FD1 and FD2 of the cell UC1 is applied to the gate of the amplification transistor Tb of the cell UC1. The voltage of the vertical data line VL in the Nth column follows the voltage applied to the gate of the amplification transistor Tb of the cell UC1, whereby the pixel signal VSig1 at the signal level is output to the vertical data line VL in the Nth column.

When the read signal READ14 is given to the readout control line HR2, the readout transistor Td1 of the cell UC1' is turned on and charges detected by the photodiode PH1 of the cell UC1' are transferred to the floating diffusions FD1 and FD2 of the cell UC1'. A voltage corresponding to a signal level of the floating diffusions FD1 and FD2 of the cell UC1' is applied to the gate of the amplification transistor Tb of the cell UC1'. The voltage of the vertical data line VL in the N+1th column follows the voltage applied to the gate of the amplification transistor Tb of the cell UC1', whereby the pixel signal VSig2 at the signal level is output to the vertical data line VL in the N+1th column.

The reset signals RESET12 and RESET15 are respectively given to the reset control lines HS1 and HS2, whereby the reset transistors Tc1 and Tc2 of the cell UC1 are turned on. At this point, the drain pulses DRAIN11 and DRAIN13 are respectively given to the drain power supply lines HD1 and HD2, whereby the potential of the floating diffusions FD1 and FD2 of the cell UC1 is set to the power supply potential.

The reset signals RESET14 and RESET17 are respectively given to the reset control lines HS1' and HS2', whereby the reset transistors Tc1 and Tc2 of the cell UC1' are turned on. At this point, the drain pulses DRAIN12 and DRAIN14 are respectively given to the drain power supply lines HD1' and HD2', whereby the potential of the floating diffusions FD1 and FD2 of the cell UC1' is set to the power supply potential.

When signals are read out from the next row, the same operation is performed.

By arranging the cells to be shifted in the longitudinal direction between the Nth column and the N+1th column, it is possible to make a layout symmetry between green cells and reduce fluctuation in colors.

Figure 6:
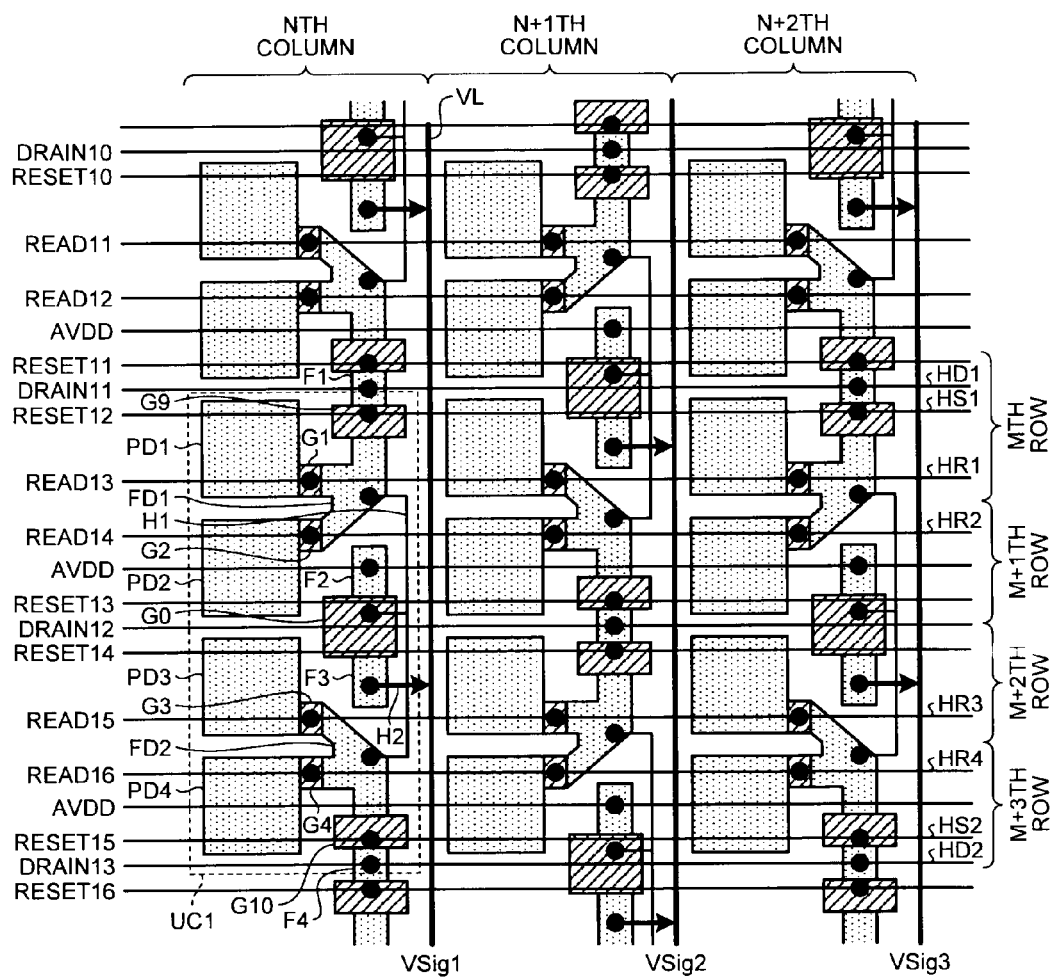
FIG. 6 is a plan view of a layout configuration of a pixel array section of the solid-state imaging device shown in FIG. 4.

FIG. 6 is a plan view of a layout configuration of a pixel array section of the solid-state imaging device shown in FIG. 4.

In FIG. 6, a layout configuration of the cell UC1 of the solid-state imaging device is the same as the layout configuration shown in FIG. 3. However, the cell UC1 in the N+1th column is arranged to be shifted in the longitudinal direction by two pixels with respect to the cell UC1 in the Nth column.

Consequently, even when the cells UC1 are arranged in zigzag, it is possible to arrange the floating diffusions FD1 and FD2 to be symmetrical to each other with respect to the gate electrode G0. Therefore, while making it possible to make a layout symmetry between green cells, it is possible to perform layout setting for the floating diffusions FD1 and FD2 such that parasitic capacitances between the floating diffusions FD1 and FD2 are equal to each other. It is possible to prevent step-like noise from occurring among the pixels while reducing fluctuation in colors.

In the example shown in FIG. 6, the method of wiring the drain power supply lines HD1 and HD2 and the power supply line VD in the lateral direction is explained. However, the drain power supply lines HD1 and HD2 and the power supply line VD can be wired in the longitudinal direction. In the example shown in FIG. 6, the wiring layout of a back-illuminated CMOS sensor is explained as the example. However, the embodiment can be applied to a front-illuminated CMOS sensor.

Third Embodiment

Figure 7:
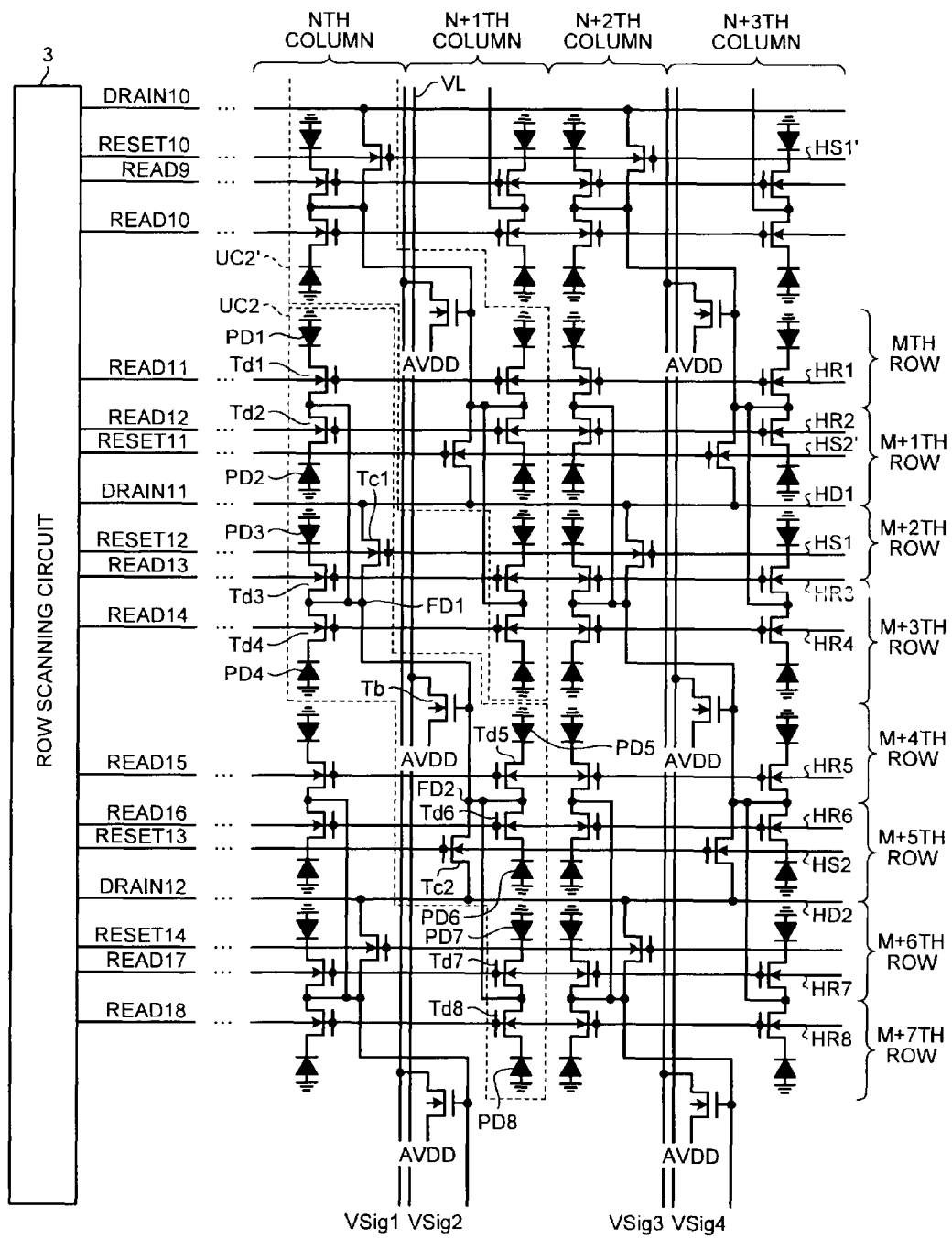
FIG. 7 is a block diagram of a schematic configuration of a solid-state imaging device according to a third embodiment.

FIG. 7 is a block diagram of a schematic configuration of a solid-state imaging device according to a third embodiment.

In FIG. 7, in the solid-state imaging device, cells UC2 are arranged in a matrix shape in a row direction and a column direction. Each of the cells UC2 includes eight photodiodes PD1 to PD8, eight readout transistors Td1 to Td8, two reset transistors Tc1 and Tc2, two floating diffusions FD1 and FD2, and one amplification transistors Tb.

The photodiodes PD1 to PD8 can convert light from an imaging target into electric signals in a pixel unit. The readout transistors Td1 to Td8 can respectively read out the signals photoelectrically converted by the photodiodes PD1 to PD8. The reset transistors Tc1 and Tc2 can simultaneously reset the signals read out from the photodiodes PD1 to PD8. The floating diffusions FD1 and FD2 are electrically connected to each other and can detect the signals read out from the photodiodes PD1 to PD8. The amplification transistor Tb is shared by the photodiodes PD1 to PD8 and can amplify the signals read out from the photodiodes PD1 to PD8.

The photodiodes PD1 to PD4 are arranged side by side in the longitudinal direction in an Nth column. The photodiode PD1 can be arranged in an Mth row, the photodiode PD2 can be arranged in an M+1th row, the photodiode PD3 can be arranged in an M+2th row, and the photodiode PD4 can be arranged in an M+3th row. The photodiodes PD5 to PD8 are arranged side by side in the longitudinal direction in an N+1th column. The photodiode PD5 can be arranged in an M+4th row, the photodiode PD6 can be arranged in an M+5th row, the photodiode PD7 can be arranged in an M+6th row, and the photodiode PD8 can be arranged in an M+7th row.

The floating diffusion FD1 is used in common as drains of the readout transistors Td3 and Td4. The floating diffusion FD2 is used in common as drains of the readout transistors Td5 and Td6. Sources of the readout transistors Td1 to Td8 are respectively connected to the photodiodes PD1 to PD8.

The floating diffusions FD1 and FD2 are arranged to be symmetrical to each other with respect to the amplification transistor Tb. The reset transistors Tc1 and Tc2 are arranged to be symmetrical to each other with respect to the amplification transistor Tb.

A drain of the reset transistor Tc1 is used in common as a drain of the reset transistor Tc2 of a cell UC2' adjacent on the upper right side of the cell UC2 to which the reset transistor Tc1 belongs. A drain of the reset transistor Tc2 is used in common as a drain of the reset transistor Tc1 of a cell adjacent on the lower left side of the cell UC2 to which the reset transistor Tc2 belongs. A source of the reset transistor Tc1 is connected to the floating diffusion FD1. A source of the reset transistor Tc2 is connected to the floating diffusion FD2.

Further, the solid-state imaging device includes a row scanning circuit 3 that scans the pixels row by row and a vertical data line VL that transmits, column by column, signals read out from the pixels. The drain power supply lines HD1 and HD2, the reset control lines HS1 and HS2, and readout control lines HR1 to HR8 are connected to the row scanning circuit 3. The readout control lines HR1 to HR8 are provided row by row. The readout control lines HR1 to HR8 are respectively connected to gates of the readout transistors Td1 to Td8. The reset control lines HS1 and HS2 are provided in the M+2th row and the M+5th row and respectively connected to gates of the reset transistors Tc1 and Tc2. The drain power supply line HD1 is provided between the M+1th row and the M+2th row and connected to the drain of the reset transistor Tc1. The drain power supply line HD2 is provided between the M+5th row and the M+6th row and connected to the drain of the reset transistor Tc2.

This row scan line is connected to the row scanning circuit 3 in a repeating unit.

A gate of the amplification transistor Tb is connected to the floating diffusions FD1 and FD2. A source of the amplification transistor Tb is connected to the vertical data line VL. A drain of the amplification transistor Tb is connected to the drain power supply AVDD.

The drain power supply AVDD can be connected in common to drains of the amplification transistors Tb of all the cells UC2 of the solid-state imaging device. The voltage of the drain power supply AVDD can be set to a fixed value.

In the example shown in FIG. 7, the method of providing the two reset transistors Tc1 and Tc2 in each of the cells UC2 is explained. However, four reset transistors can be provided in each of the cells UC2.

Figure 8:
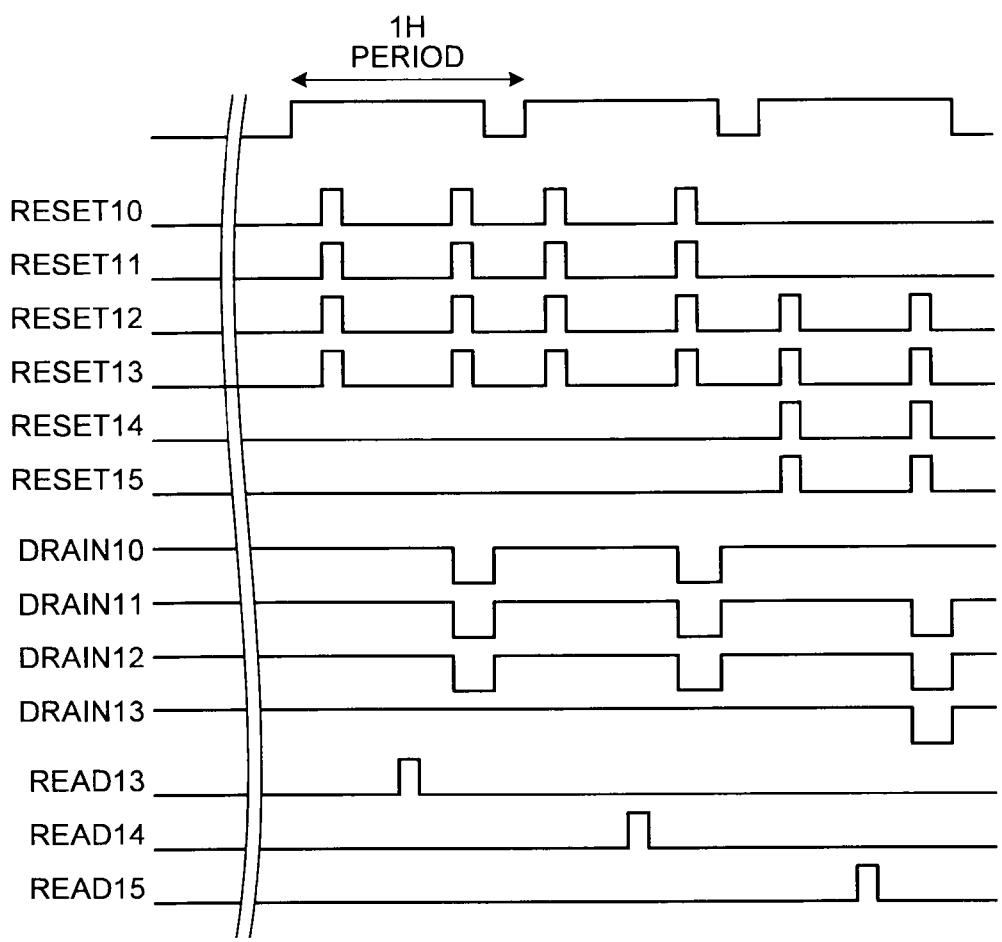
FIG. 8 is a timing chart of readout operation of the solid-state imaging device shown in FIG. 7.

FIG. 8 is a timing chart of readout operation of the solid-state imaging device shown in FIG. 7.

In FIG. 8, for example, a signal is read out from the pixel in the Nth column and the M+2th row. The reset signals RESET12 and RESET13 are respectively given to the reset control lines HS1 and HS2, whereby the reset transistors Tc1 and Tc2 are turned on and the charges of the floating diffusions FD1 and FD2 are reset. A voltage corresponding to a reset level of the floating diffusions FD1 and FD2 is applied to the gate of the amplification transistor Tb. The voltage of the vertical data line VL in the N+1th column follows the voltage applied to the gate of the amplification transistor Tb, whereby the pixel signal VSig2 at the reset level is output to the vertical data line VL in the N+1th column.

At this point, the reset signals RESET10 and RESET11 are respectively given to the reset control lines HS1' and HS2' as well, whereby the reset transistor Tc2 of the cell UC2' that shares the drain with the reset transistor Tc1 of the cell UC2 is turned on. The reset transistor Tc1 of the cell UC2' electrically connected to the reset transistor Tc2 of the cell UC2' is turned on.

Subsequently, the read signal READ13 is given to the readout control line HR3, whereby the readout transistor Td3 is turned on and charges detected by the photodiode PD3 are transferred to the floating diffusion FD1 and FD2. A voltage corresponding to a signal level of the floating diffusions FD1 and FD2 is applied to the gate of the amplification transistor Tb. The voltage of the vertical data line VL in the N+1th column follows the voltage applied to the gate of the amplification transistor Tb, whereby the pixel signal VSig2 at the signal level is output to the vertical data line VL in the N+1th column.

The reset signals RESET12 and RESET13 are respectively given to the reset control lines HS1 and HS2, whereby the reset transistors Tc1 and Tc2 are turned on. At this point, the drain pulses DRAIN11 and DRAIN12 are respectively given to the drain power supply lines HD1 and HD2, whereby the potential of the floating diffusions FD1 and FD2 is set to power supply potential.

When signals are read out from the next row, the same operation is performed.

By providing the two reset transistors Tc1 and Tc2 in the cell UC2 in which eight pixels are shared by the one amplification transistor Tb, it is possible to arrange the reset transistors Tc1 and Tc2 to be symmetrical to each other with respect to the amplification transistor Tb. Therefore, it is possible to perform layout setting for the floating diffusions FD1 and FD2 such that parasitic capacitances between the floating diffusions FD1 and FD2 are equal to each other. It is possible to prevent step-like noise from occurring among the pixels.

Figure 9:
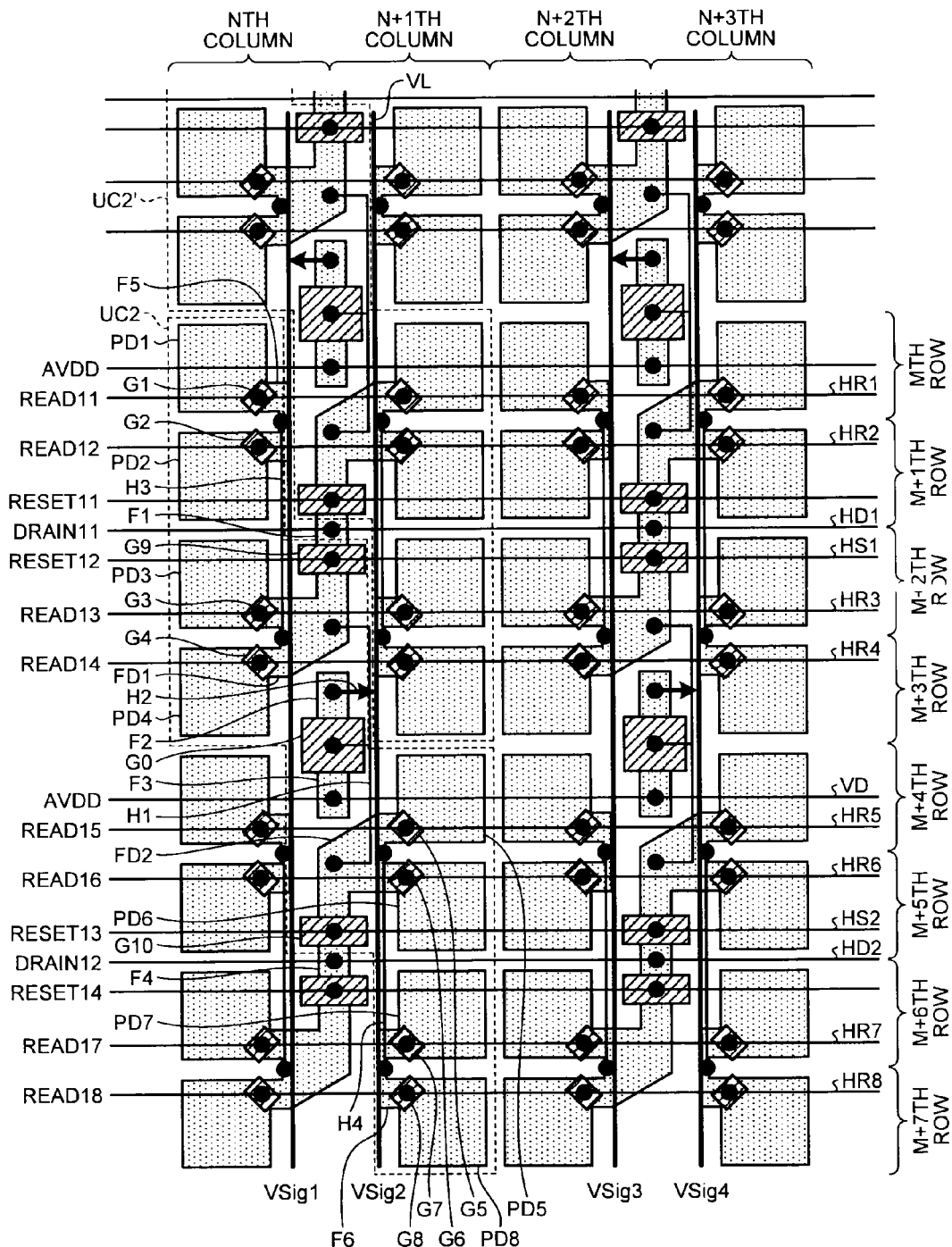
FIG. 9 is a plan view of a layout configuration of a pixel array section of the solid-state imaging device shown in FIG. 7.

FIG. 9 is a plan view of a layout configuration of a pixel array section of the solid-state imaging device shown in FIG. 7.

In FIG. 9, on a semiconductor substrate, the four photodiodes PD1 to PD4 belonging to the cell UC2 are arranged side by side in the longitudinal direction in the Nth column. The four photodiodes PD5 to PD8 belonging to the cell UC2 are arranged side by side in the longitudinal direction in the N+1th column. The floating diffusion FD1 is arranged to be adjacent to the photodiodes PD3 and PD4. The floating diffusion FD2 is arranged to be adjacent to the photodiodes PD5 and PD6. An impurity diffusion layer F5 is arranged to be adjacent to the photodiodes PD1 and PD2. An impurity diffusion layer F6 is arranged to be adjacent to the photodiodes PD7 and PD8.

The gate electrode G3 is arranged between the photodiode PD3 and the floating diffusion FD1. The gate electrode G4 is arranged between the photodiode PD4 and the floating diffusion FD1. The gate electrode G5 is arranged between the photodiode PD5 and the floating diffusion FD2. The gate electrode G6 is arranged between the photodiode PD6 and the floating diffusion FD2. The gate electrode G1 is arranged between the photodiode PD1 and the impurity diffusion layer F5. The gate electrode G2 is arranged between the photodiode PD2 and the impurity diffusion layer F5. The gate electrode G7 is arranged between the photodiode PD7 and the impurity diffusion layer F6. The gate electrode G8 is arranged between the photodiode PD8 and the impurity diffusion layer F6. The gate electrodes G1 to G8 can respectively configure the readout transistors Td1 to Td8.

The impurity diffusion layer F1 is arranged in a boundary with a cell adjacent on the upper right side. The gate electrode G9 is arranged between the floating diffusion FD1 and the impurity diffusion layer F1. The impurity diffusion layer F4 is arranged in a boundary with a cell adjacent on the lower left side. The gate electrode G10 is arranged between the floating diffusion FD2 and the impurity diffusion layer F4. The gate electrodes G9 and G10 can respectively configure the reset transistors Tc1 and Tc2.

The impurity diffusion layers F2 and F3 are arranged between the floating diffusions FD1 and FD2. The gate electrode G0 is arranged between the impurity diffusion layers F2 and F3. The gate electrode G0 can configure the amplification transistor Tb. The floating diffusions FD1 and FD2 are arranged to be symmetrical to each other with respect to the gate electrode G0. The upper side and the lower side of the cell UC1 are arranged to be point symmetrical to each other with respect to the gate electrode G0.

The reset transistors Tc1 and Tc2 and the amplification transistor Tb are arranged between the photodiodes PD1 to PD8 in the Nth column and the photodiodes PD1 to PD8 in the N+1th column.

The floating diffusions FD1 and FD2 are connected to each other via the wire H1. The floating diffusion FD1 and the impurity diffusion layer F5 are connected to each other via a wire H3. The floating diffusion FD2 and the impurity diffusion layer F6 are connected to each other via a wire H4. The impurity diffusion layer F2 is connected to the vertical data line VL via the wire H2. The drain power supply line HD1 is connected to the impurity diffusion layer F1. The drain power supply line HD2 is connected to the impurity diffusion layer F4.

The reset control line HS1 is connected to the gate electrode G9. The reset control line HS2 is connected to the gate electrode G10. The readout control lines HR1 to HR8 are respectively connected to the gate electrodes G1 to G8. The power supply line VD is connected to the impurity diffusion layer F3.

Consequently, even when the one amplification transistor Tb is shared by the eight photodiodes PD1 to PD8, it is possible to arrange the floating diffusions FD1 and FD2 to be symmetrical to each other with respect to the gate electrode G0. Therefore, while making it possible to increase the area of the photodiodes PD1 to PD8, it is possible to perform layout setting for the floating diffusions FD1 and FD2 such that parasitic capacitances between the floating diffusions FD1 and FD2 are equal to each other. It is possible to prevent step-like noise from occurring among the pixels while improving sensitivity.

In the example shown in FIG. 9, the method of wiring the drain power supply lines HD1 and HD2 and the power supply line VD in the lateral direction is explained. However, the drain power supply lines HD1 and HD2 and the power supply line VD can be wired in the longitudinal direction. In the example shown in FIG. 9, the wiring layout of a back-illuminated CMOS sensor is explained as the example. However, the embodiment can be applied to a front-illuminated CMOS sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a cell including K (K is an integer equal to or larger than 2) pixels;
an amplification transistor shared by the K pixels and configured to amplify signals read out from the pixels; and
a plurality of reset transistors configured to reset the signals read out from the K pixels.

2. The solid-state imaging device according to claim 1, wherein the reset transistors simultaneously reset the signals read out from the K pixels.

3. The solid-state imaging device according to claim 1, wherein a drain of the amplification transistor is driven separately from drains of the reset transistors.

4. The solid-state imaging device according to claim 1, further comprising floating diffusions respectively provided to correspond to the reset transistors.

5. The solid-state imaging device according to claim 1, wherein a drain of the reset transistor is shared between the cells adjacent to each other.

6. The solid-state imaging device according to claim 1, wherein the reset transistors are arranged symmetrically with respect to the amplification transistor.

7. The solid-state imaging device according to claim 1, wherein four pixels arrayed in a longitudinal direction are provided in the cell and symmetrically arranged in a unit of two pixels with respect to the amplification transistor.

8. The solid-state imaging device according to claim 7, wherein the amplification transistor in an odd number column is arranged to be shifted in the longitudinal direction by two pixels with respect to the amplification transistor in an even number column.

9. The solid-state imaging device according to claim 1, wherein eight pixels arrayed in a longitudinal direction are provided in the cell and symmetrically arranged in a unit of four pixels with respect to the amplification transistor.

10. The solid-state imaging device according to claim 4, further comprising:
photodiodes configured to convert light from an imaging target in a pixel unit; and
readout transistors configured to read out, in a pixel unit, signals photoelectrically converted by the photodiodes.

11. The solid-state imaging device according to claim 10, wherein the photodiodes are arranged side by side adjacent in a column direction in the cell.

12. The solid-state imaging device according to claim 11, wherein the amplification transistor, the reset transistors, the floating diffusions, the readout transistors of a cell in an Nth (N is a positive integer) column are arranged between the photodiode of the cell in the Nth column and the photodiode of a cell in an N+1th column.

13. The solid-state imaging device according to claim 12, wherein
the amplification transistor of the cell in the Nth column and the amplification transistor of the cell in the N+1th column are arranged in a same row, and
the reset transistor of the cell in the Nth column and the reset transistor of the cell in the N+1th column are arranged in a same row.

14. The solid-state imaging device according to claim 12, wherein
the amplification transistor of the cell in the Nth column and the reset transistor of the cell in the N+1th column are arranged in a same row, and
the reset transistor of the cell in the Nth column and the amplification transistor of the cell in the N+1th column are arranged in a same row.

15. The solid-state imaging device according to claim 1, wherein the cell is configured in a unit of four pixels and includes a first reset transistor shared by the pixel in an Mth (M is a positive integer) row and the pixel in an M+1th row and a second reset transistor shared by the pixel in an M+2th row and the pixel in an M+3th row.

16. The solid-state imaging device according to claim 15, wherein
a drain of the first reset transistor is used in common as a drain of a third reset transistor shared by the pixel in an M−1th row and the pixel in an M−2th row, and
a drain of the second reset transistor is used in common as a drain of a fourth reset transistor shared by the pixel in an M+4th row and the pixel in an M+5th row.

17. The solid-state imaging device according to claim 10, wherein the photodiodes are arranged in an Nth (N is a positive integer) column and an N+1th column in the cell.

18. The solid-state imaging device according to claim 17, wherein the amplification transistor, the reset transistors, the floating diffusions, the readout transistors of a cell in the Nth column are arranged between the photodiode in the Nth column of the cell in the Nth column and the photodiode in the N+1th column of the cell in the Nth column.

19. The solid-state imaging device according to claim 1, wherein the cell is configured in a unit of eight pixels and includes a first reset transistor shared by the pixel in an Mth row, the pixel in an M+1th row, the pixel in an M+2th row, and the pixel in an M+3th row in an Nth column and a second reset transistor shared by the pixel in an M+4th row, the pixel in an M+5th row, the pixel in an M+6th row, and the pixel in an M+7th row in an N+1th column.

20. The solid-state imaging device according to claim 19, wherein
a drain of the first reset transistor is used in common as a drain of a third reset transistor shared by the pixel in then Mth row, the pixel in the M+1th row, the pixel in the M+2th row, and the pixel in the M+3th row in the N+1th column, and
a drain of the second reset transistor is used in common as a drain of a fourth reset transistor shared by the pixel in the M+4th row, the pixel in the M+5th row, the pixel in the M+6th row, and the pixel in the M+7th row in the Nth column.

* * * * *